United States Patent
McDonald

(10) Patent No.: US 9,980,361 B2
(45) Date of Patent: May 22, 2018

(54) THERMALLY ISOLATED THERMIONIC HOLLOW CATHODES

(71) Applicant: The United States of America, as represented by the Secretary of the Navy, Washington, DC (US)

(72) Inventor: Michael S. McDonald, Springfield, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days. days.

(21) Appl. No.: 15/625,898

(22) Filed: Jun. 16, 2017

(65) Prior Publication Data

US 2017/0367168 A1    Dec. 21, 2017

Related U.S. Application Data

(60) Provisional application No. 62/350,834, filed on Jun. 16, 2016.

(51) Int. Cl.
  *F03H 1/00*    (2006.01)
  *H05H 1/24*    (2006.01)
  *B64G 1/40*    (2006.01)

(52) U.S. Cl.
  CPC .............. *H05H 1/24* (2013.01); *B64G 1/405* (2013.01); *F03H 1/0075* (2013.01)

(58) Field of Classification Search
  CPC ......... H01J 31/127; H01J 1/316; B82Y 10/00; G09G 2300/0885; G09G 2310/06
  See application file for complete search history.

(56) References Cited

U.S. PATENT DOCUMENTS

| 4,569,198 A | * | 2/1986 | Cann | ..................... B64G 1/405 313/43 |
| 4,588,490 A | * | 5/1986 | Cuomo | ............... H01J 37/3405 204/192.11 |
| 2008/0047256 A1 | * | 2/2008 | Gallimore | ............. H01J 27/022 60/202 |

OTHER PUBLICATIONS

Hollow Cathode Without Low-Work-Function Insert, 29th International Electric Propulsion Conference, Oct. 31, 2005.

* cited by examiner

*Primary Examiner* — Tracie Y Green
(74) *Attorney, Agent, or Firm* — US Naval Research Laboratory; Scott G. Bell

(57) ABSTRACT

Embodiments relate to a hallow cathode with integral layers of radiation shielding. The hollow cathode includes an inner cathode tube that forms a gas feed to direct gas toward a downstream end, where the directed gas forms plasma. A heater element is positioned at the downstream end of the inner cathode tube, the heater element to heat the plasma. The hollow cathode further includes an outer cathode tube with a keeper electrode to sustain a bias voltage across a gap at a downstream end of the outer cathode tube for igniting the plasma. The integral layers of radiation shielding are connected by offset radial supports and are incorporated as a single element with either the inner or outer cathode tube, where the integral layers are nested with torturous conductive paths to reduce radiation and conduction losses from the downstream end of the inner cathode tube.

16 Claims, 4 Drawing Sheets

THERMALLY ISOLATED THERMIONIC HOLLOW CATHODES

CROSS-REFERENCE TO RELATED APPLICATIONS

This Application is a non-provisional application claiming priority to provisional application 62/350,834 filed on Jun. 16, 2016, under 35 USC 119(e). The entire disclosure of the provisional application is incorporated herein by reference.

BACKGROUND

Thermionic hollow cathodes are traditionally used to ignite plasma propulsion thrusters such as Hall thrusters and gridded ion thrusters for spacecraft propulsion, and the cathodes can also neutralize the positively charged ion beam with negatively charged electrons and serve as the negative electrode of the thrusters' electric circuit. The cathodes function by heating a specially chosen material, the thermionic electron emitter, to temperatures sufficient to essentially "boil" off electrons into free space. Most materials melt before this occurs to any significant degree, so in practice only two materials are currently used, both of which operate typically in excess of 1,000° C. and up as high as 1,700° C.

Maintaining these high temperatures (T) requires large power inputs, primarily due to radiation losses proportional to the fourth power of temperature ($T^4$) and conduction losses through the cathode mechanical structure. As a result, substantial effort is put into minimizing both effects in the cathode design. As shown in FIGS. 1 and 3, the cathode body 100 or 300 is typically constructed as a long tube with thin walls 102 or 302, with the emitter at the tip 108 or 308, to minimize conductive losses, while the tip is also wrapped in several layers of a refractory metal foil 114 or 314 such as tantalum to reduce radiation losses.

However, these long, thin tubes 102 or 302 are difficult to fabricate, and the radiation shielding 114 or 314 can present an electrical shorting risk in the cathode. The long tubes 102 or 302 also have to survive launch loads to get into space, including vibration and shock, thus requiring a certain amount of mechanical strength. Both of these constraints effectively limit both the aspect ratio (length/diameter) of the tube 102 or 302, longer tubes with small diameter being harder to fabricate and qualify, and also the wall thickness that can be achieved via conventional machining techniques, thinner walls being more difficult. These limits hamper efforts to reduce conductive losses by increasing thermal resistance via longer and thinner conductive pathways. Additionally, radiation shielding 114 or 314 reaches a point of diminishing returns due to conduction from layer to layer across their continuous wrapping, and the shielding 114 or 314 prevents only radiation in the radial direction when applied as a tubular layer of foil, which makes it difficult to prevent axial radiation losses away from the hot emitting tip area in either the upstream or downstream directions parallel to the cathode central axis.

SUMMARY

Embodiments relate to a hallow cathode with integral layers of radiation shielding. The hollow cathode includes an inner cathode tube that forms a gas feed to direct gas toward a downstream end, where the directed gas forms plasma. A heater element is positioned at the downstream end of the inner cathode tube, the heater element to heat the plasma. The hollow cathode further includes an outer cathode tube with a keeper electrode to sustain a bias voltage across a gap at a downstream end of the outer cathode tube for igniting the plasma. The integral layers of radiation shielding are connected by offset radial supports and are incorporated as a single element with either the inner or outer cathode tube, where the integral layers are nested with torturous conductive paths to reduce radiation and conduction losses from the downstream end of the inner cathode tube.

DESCRIPTION

Embodiments of the invention are designed to enhance thermal isolation of the very hot tip of a thermionically emitting cathode. This enhanced isolation reduces the electrical power required to keep the cathode operating, making it more efficient and thus more attractive for use in space applications where power is limited. The use of titanium in particular is attractive for upcoming slightly lower temperature cathodes due to its current 3D-printability, low thermal conductivity, further enhancing the effect; however, titanium melts at too low a temperature for today's cathodes.

Figure 1:
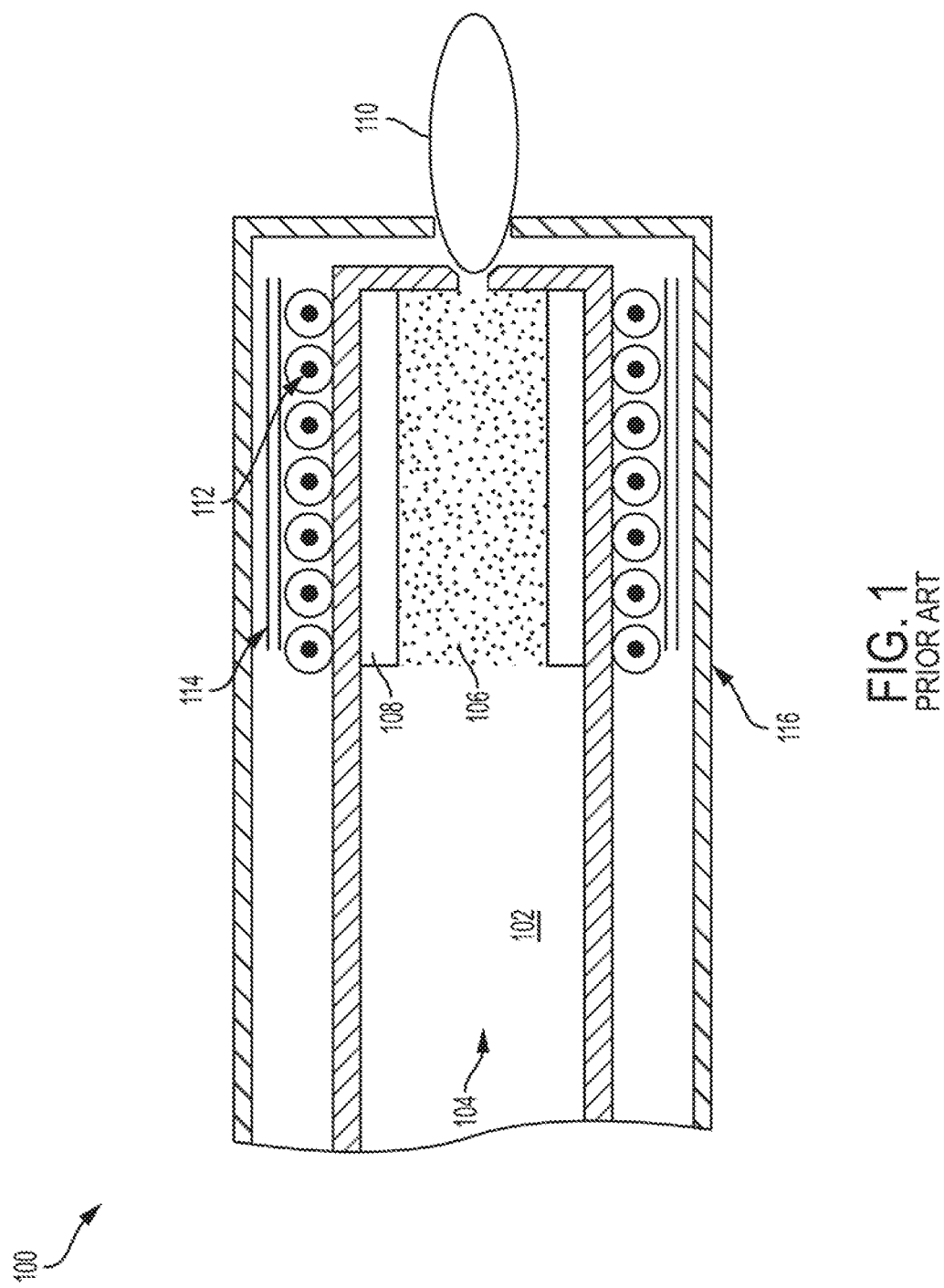
FIG. 1 is a diagram of a typical hollow cathode.
Figure 2:
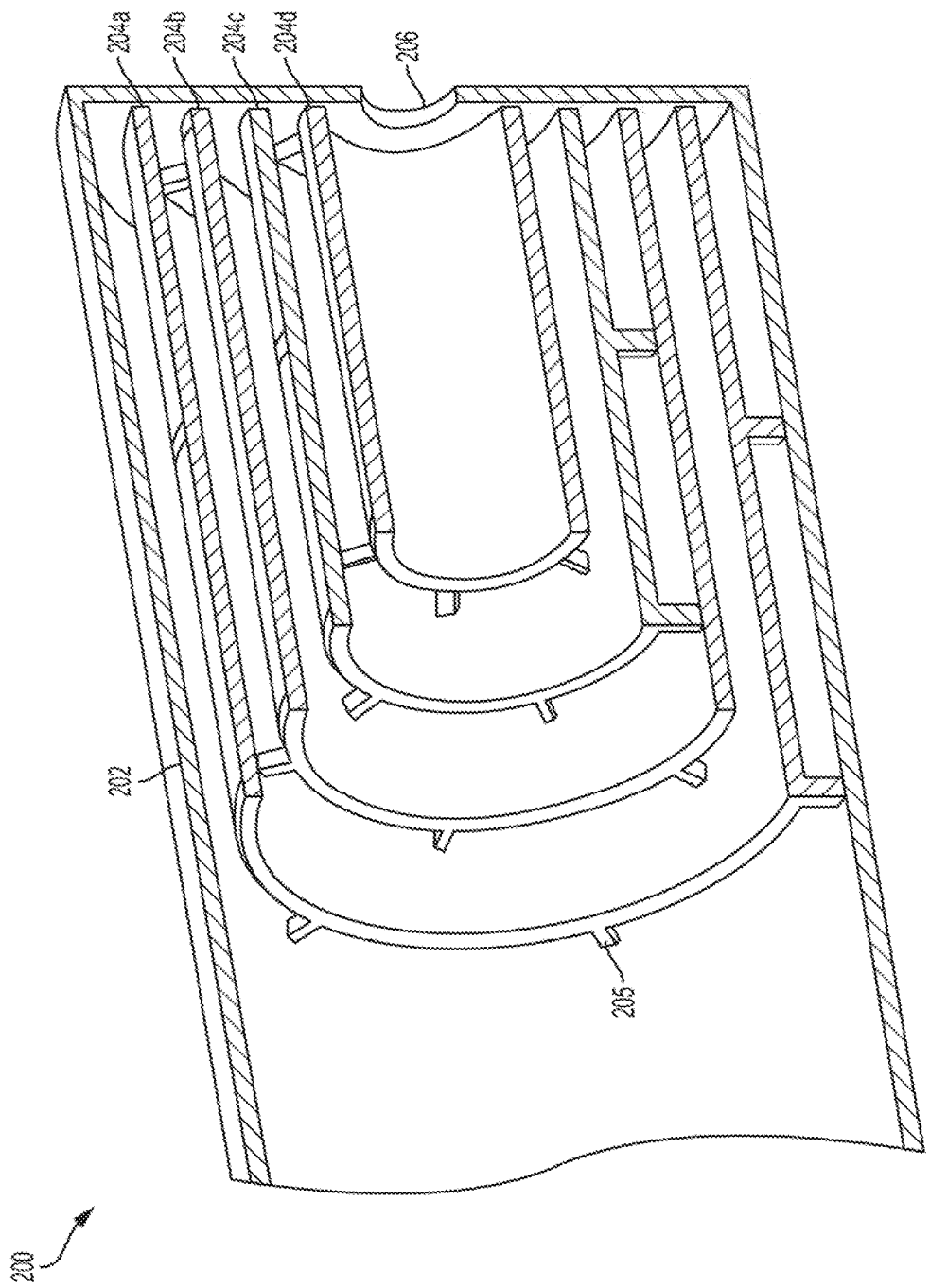
FIG. 2 is an example integral radiation shield and keeper.
Figure 3:
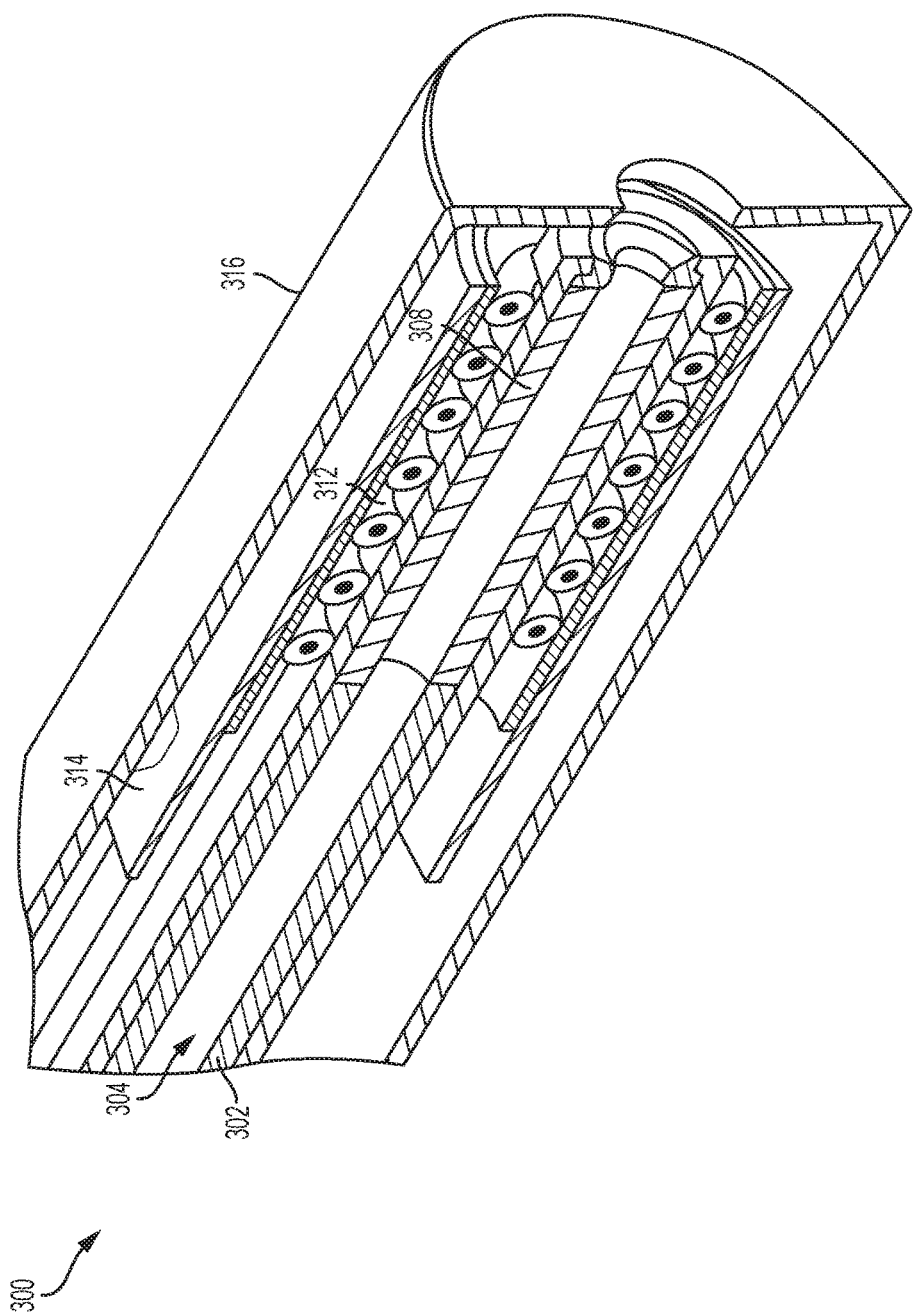
FIG. 3 is a detailed diagram of a typical hollow cathode.

Embodiments of the invention use 3D printing (though any additive manufacturing, investment casting such as lost wax, or other technique could be used) to create a cathode tube structure 200 for the keeper 202 or outermost tube in the hollow cathode as shown in FIG. 2. The tube structure 200 has integral layers of radiation shielding 204a-204d that are connected by thin, offset radial supports 205 to provide a torturous conductive path for heat to travel from the hot thermionic emitter to the cooler supporting end of the tubes while maintaining several layers of radiation shielding 204a-204d. More layers reduce radiation and conduction losses but require additional mass and diameter for the cathode, so the ideal number of layers should strike a balance chosen by the designer based on specific mission and application constraints and requirements.

The construction of the cathode tube structure 200 as a single element makes adding additional layers 204a-204d of radiation shield no more difficult than manufacturing a conventional keeper, while reducing parts count and complexity of the overall system. The additional layers 204a-204d and the radial supports 205 linking them also effectively form a truss structure to increase mechanical strength, which allows for thinner walls and further reduces thermal conduction losses down the body of the cathode.

In some embodiments, the use of the titanium construction reduces overall thermal conductivity of the structure 200. Such titanium construction may not suitable for current cathodes operating well over 1000° C. and instead can be suitable for future cathodes that run at cooler temperatures. Further, other materials are may soon be fabricable via these additive manufacturing methods and so the principle discussed above should apply regardless of the chosen material.

A convenient number of azimuthal locations for radial supports in the radiation shield is three, with two axial locations. The proper choice of support number and location is a function of the selected material's thermal conductivity and thermal emissivity given a fixed thickness of each nested layer. In a material of low thermal conductivity and high emissivity, such as the additively manufactured titanium alloy in this embodiment, more inter-layer supports of larger cross-sectional area may be supported while still maintaining a radiation-dominated thermal environment. In more conductive, less emissive materials such as copper or molybdenum, fewer supports of smaller cross-sectional area are needed to prevent excessive thermal conduction between layers that becomes comparable to the radiative heat transfer. In materials with significant creep at expected operating temperatures, additional inter-layer supports may also be required.

Other materials that can be used to construct structure 200 include, but are not limited to: Tungsten, Carbon (e.g., various forms of conductive carbon, including graphite, vitreous, etc.) Tantalum, Rhenium, Tungsten Carbide, Zirconium Boride, Zirconium Carbide, Zirconium Nitride, Tantalum Nitride, and Tantalum Carbide. Of the lower temperature materials compatible with lower temperature cathodes, stainless steel, nickel alloys (esp. with iron, chromium and/or molybdenum) and titanium may be preferred due to their combination of good electrical conductivity with relatively low thermal conductivity. Other materials with good electrical conductivity and relatively low thermal conductivity can also be suitable.

In addition to thermal isolation achieved by thinner walls and additional layers of radiation shielding 204a-204d, integral structures may also be used to increase mechanical strength of the hollow cathode. For example, internal trusses, honeycombing, stringers, or other strengthening structures may be used. These are not discussed in detail below and are not intended to be an exhaustive list as other methods will be familiar to those knowledgeable about mechanical reinforcement or structural engineering.

Figure 4:
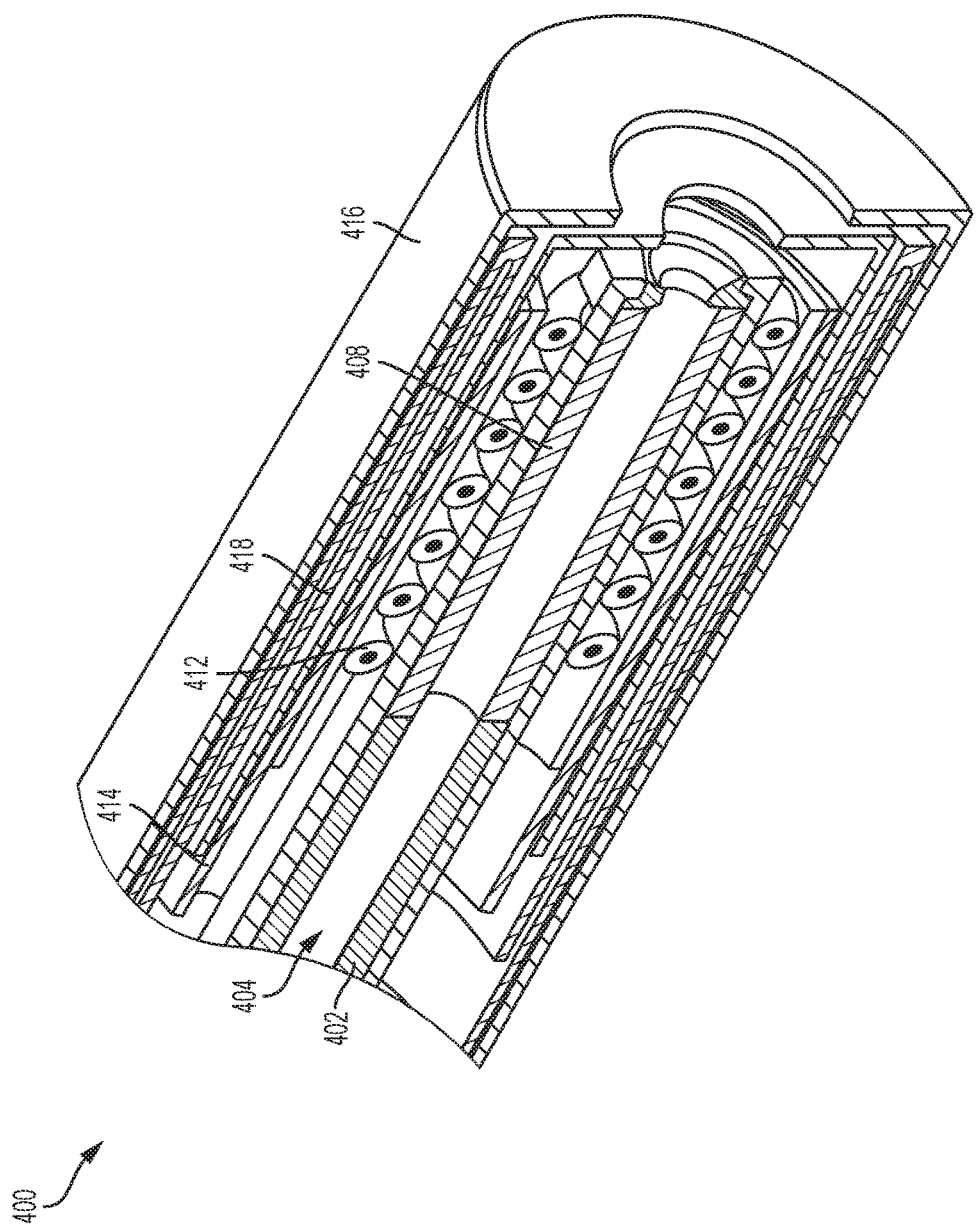
FIG. 4 is an example hollow cathode with integral radiation shield and keeper.

Alternatively, the additional layers of radiation shielding could be integrated on an inner cathode tube (such as 402 of FIG. 4). In this case, the inner cathode tube may be constructed as a single element similar to as described above with respect to FIG. 2. In another embodiment, rather than additional layers being included in the keeper or inner cathode tube, a third structure interstitial between the keeper and tube can be used as the additional layers of radiation shielding. In this case, the third structure could be a solid multilayer radiation shield with radial supports that are similar to as described above with respect to FIG. 2.

In yet another embodiment, a single element that comprises the cathode tube, interstitial heat shield, and outer keeper electrode can be constructed similar to as described above. In this example, the radiation shield can be an electrical insulator able to keep the cathode tube and keeper electrode spaced apart and unable to short-circuit.

In addition to structures enhancing the design of a typical hollow cathode of constant cross-sectional diameter, it is also desirable to change the overall structure of the cathode to begin from a smaller diameter at the cool, upstream end of the device and expand to a larger diameter at the tip to support the integral radiation shielding as well as any external heaters that may be desired at the cathode tip. By maintaining the diameter of all cathode components at the smallest possible value that still permits adequate electrical isolation and overall mechanical strength (for example if the aforementioned internal trusses were used), the conductive cross-sectional area available is reduced for thermal conduction away from the tip. The described structure with a variable cross-sectional diameter contrasts with today's state of the art device where most cathode component diameters (i.e., barrel and keeper) are sized along their entire length to accommodate the larger-diameter tip section; thus, unnecessarily increasing the thermal losses away from the hot tip section.

In some embodiments, the axial length of the radiation shield layers can be decreased as one moves inward from the cooler outer shells toward the hot thermionic emitter, as too long a radiation shield may inadvertently provide an axial conduction path for heat to follow before re-radiating outward, which may enhance the emitter's thermal losses.

In addition to integral structures of a single, homogeneous material, low-thermal conductivity materials can be incorporated for the radial supports between radiation layers 204a-204d in some embodiments. In these cases, the coefficient of thermal expansion between the materials should be matched to prevent stress cracking or failure of the part under the thermal cycles typical to a hollow cathode's operation.

In addition to single structures of a single or multiple materials for the purposes of thermal and mechanical advantages as discussed above, an allowance may be made at the emitting tip of the cathode structures for a coating or otherwise attached shield (e.g., a threaded attachment like a silencer on a gun or a bayonet coupling like used on circular electrical connectors) composed of a low-sputtering component such as graphite to protect structural materials from erosive plasma bombardment. In this example, a graphite shield can provide the low-sputtering, long lifetime qualities without the poor mechanical properties of graphite when used across the entire cathode structure. Such a coating/shield would allow the selection of otherwise ideal materials for the thermal control and electrical conductivity in the cathode keeper while enhancing survivability of the cathode over required lifetimes that may reach to the thousands or tens of thousands of hours, where ion bombardment of the underlying material can be detrimental or fatal to the cathode's operation.

In the particular case of lanthanum hexaboride (LaB6) cathodes, where materials are also chosen for their compatibility with high temperature boron exposure (which causes corruption and embrittlement of metal crystal structures over time) and where graphite and rhenium are currently used, a high temperature conducting boride such as zirconium diboride can be used.

Cathode keeper tubes with integral radiation shielding can be fabricated more simply than conventional machining of a long thin tube and with the same level of effort as 3D-printing, other additively manufacturing techniques, or investment casting a conventional-shaped tube. Embodiments described herein provide enhanced thermal isolation and thus power efficiency for spacecraft, which are sensitive to power consumption. This is especially attractive for the growing prevalence of so-called "small satellites", which have very low power budgets but are easier to launch.

Embodiments of the invention allow for enhanced mechanical strength using internal structures to preserve a cathode structure's robustness even as the 3D printing or other fabrication technology allows for much thinner walls, which is attractive for reduced thermal conduction, than would be possible with conventional machining. In some cases, the enhanced internal structures may be fabricated using a conventional arrangement of a straight tube with a lip on the end.

FIG. 4 is an example hollow cathode 400 with integral radiation shield 418 and keeper 416. The hollow cathode 400 includes an inner cathode tube 402 that forms a gas feed 404 to direct gas toward a cathode insert 408 that is inserted into an end of the inner cathode tube 402. The gas forms plasma in the cathode insert 408, where a heating element 412 heats the plasma to generate a plasma discharge. The heating element 412 is wrapped in radiation shielding 414, which in turn is encompassed by an outer cathode tube that includes the integral radiation shield 418 and keeper 416. The outer cathode tube may be similar to cathode tube structure 200 described above with respect to FIG. 2.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

The invention claimed is:

1. A hollow cathode comprising:
an inner cathode tube forming a gas feed to direct gas toward a downstream end of the inner cathode tube, wherein the directed gas forms plasma at the downstream end of the inner cathode tube;
a heater element positioned at the downstream end of the inner cathode tube, the heater element to heat the plasma at the downstream end of the inner cathode tube; and
an outer cathode tube comprising a keeper electrode and a plurality of integral layers of radiation shielding that are connected by offset radial supports,
the plurality of integral layers of radiation shielding being nested with torturous conductive paths to reduce radiation and conduction losses from the downstream end of the inner cathode tube, and
the keeper electrode to sustain a bias voltage across a gap at a downstream end of the outer cathode tube for igniting the plasma in the gap.

2. The hollow cathode of claim 1, wherein the outer cathode tube is a titanium alloy, a nickel alloy, or stainless steel.

3. The hollow cathode of claim 1, the outer cathode tube is constructed as a single integral component that forms the keeper electrode and the plurality of integral layers of radiation shielding.

4. The hollow cathode of claim 1, wherein the offset radial supports comprises at least two axial supports with respect to the gas feed and at least three radial supports.

5. The hollow cathode of claim 4, wherein the at least three radial supports are a low-thermal conductivity material.

6. The hollow cathode of claim 1, wherein the plurality of integral layers of radiation shielding are further connected by internal trusses, honeycombed supports, or stringers.

7. The hollow cathode of claim 1, wherein an upstream end of the outer cathode tube has a smaller diameter than a downstream end of the outer cathode tube.

8. The hollow cathode of claim 1, wherein the outer cathode tube is constructed as a single element.

9. A hollow cathode comprising:
an inner cathode tube comprising a gas feed and a plurality of integral layers of radiation shielding that are connected by offset radial supports,
the gas feed to direct gas toward a downstream end of the inner cathode tube, wherein the directed gas forms plasma at the downstream end of the inner cathode tube, and
the plurality of integral layers of radiation shielding being nested with torturous conductive paths to reduce radiation and conduction losses from the downstream end of the inner cathode tube;
a heater element positioned at the downstream end of the inner cathode tube, the heater element to heat the plasma at the downstream end of the inner cathode tube; and
an outer cathode tube comprising a keeper electrode to sustain a bias voltage across a gap at a downstream end of the outer cathode tube for igniting the plasma in the gap.

10. The hollow cathode of claim 9, wherein the outer cathode tube is a titanium alloy, a nickel alloy, or stainless steel.

11. The hollow cathode of claim 9, the outer cathode tube is constructed as a single integral component that forms the keeper electrode and the plurality of integral layers of radiation shielding.

12. The hollow cathode of claim 9, wherein the offset radial supports comprises at least two axial supports with respect to the gas feed and at least three radial supports.

13. The hollow cathode of claim 12, wherein the at least three radial supports are a low-thermal conductivity material.

14. The hollow cathode of claim 9, wherein the plurality of integral layers of radiation shielding are further connected by internal trusses, honeycombed supports, or stringers.

15. The hollow cathode of claim 9, wherein an upstream end of the outer cathode tube has a smaller diameter than a downstream end of the outer cathode tube.

16. The hollow cathode of claim 9, wherein the inner cathode tube is constructed as a single element.

* * * * *